(12) United States Patent
Liao et al.

(10) Patent No.: US 7,669,120 B2
(45) Date of Patent: Feb. 23, 2010

(54) METHOD AND SYSTEM FOR ENCODING A MARK-UP LANGUAGE DOCUMENT

(75) Inventors: Hongbin Liao, Beijing (CN); Qian Zhang, Wuhan (CN); Wenwu Zhu, Basking Ridge, NJ (US)

(73) Assignee: Microsoft Corporation, Redmond, WA (US)

( * ) Notice: Subject to any disclaimer, the term of this patent is extended or adjusted under 35 U.S.C. 154(b) by 193 days.

(21) Appl. No.: 10/177,830

(22) Filed: Jun. 21, 2002

(65) Prior Publication Data

US 2004/0003343 A1 Jan. 1, 2004

(51) Int. Cl.
*G06F 17/00* (2006.01)
(52) U.S. Cl. .................. 715/242; 715/234; 715/239; 715/249; 701/101
(58) Field of Classification Search ............... 715/523, 715/513, 501.1, 205, 234.242, 249, 234, 715/239, 242; 701/101
See application file for complete search history.

(56) References Cited

U.S. PATENT DOCUMENTS

| | | | | |
|---|---|---|---|---|
| 5,185,698 A * | 2/1993 | Hesse et al. | ............. | 715/203 |
| 5,991,713 A * | 11/1999 | Unger et al. | ............. | 704/9 |
| 6,635,088 B1 * | 10/2003 | Hind et al. | ............. | 715/513 |
| 6,665,731 B1 * | 12/2003 | Kumar et al. | ............. | 709/246 |
| 6,711,740 B1 * | 3/2004 | Moon et al. | ............. | 719/328 |
| 6,725,424 B1 * | 4/2004 | Schwerdtfeger et al. | ... | 715/513 |
| 6,732,109 B2 * | 5/2004 | Lindberg et al. | ............. | 707/101 |
| 6,782,380 B1 * | 8/2004 | Thede | ............. | 707/3 |
| 6,804,677 B2 * | 10/2004 | Shadmon et al. | ............. | 707/101 |
| 6,845,380 B2 * | 1/2005 | Su et al. | ............. | 707/102 |
| 6,883,137 B1 * | 4/2005 | Girardot et al. | ............. | 715/513 |
| 7,043,686 B1 * | 5/2006 | Maruyama et al. | ............. | 715/242 |
| 7,089,567 B2 * | 8/2006 | Girardot et al. | ............. | 719/330 |
| 7,143,397 B2 * | 11/2006 | Imaura | ............. | 717/136 |
| 7,178,100 B2 * | 2/2007 | Call | ............. | 715/210 |
| 2001/0054172 A1 * | 12/2001 | Tuatini | ............. | 717/1 |
| 2002/0026462 A1 * | 2/2002 | Shotton et al. | ............. | 707/523 |
| 2002/0032706 A1 * | 3/2002 | Perla et al. | ............. | 707/530 |
| 2002/0038320 A1 * | 3/2002 | Brook | ............. | 707/513 |

(Continued)

FOREIGN PATENT DOCUMENTS

JP  11219308 A  3/2002

(Continued)

OTHER PUBLICATIONS

Girardot, Marc, et al., "Millau: An Encoding Format for Efficient Representation and Exchange of XML Over the Web", Computer Networks, vol. 33, Jun. 2000, pp. 747-765.*

(Continued)

*Primary Examiner*—Robert Stevens
(74) *Attorney, Agent, or Firm*—Lee & Hayes, PLLC

(57) ABSTRACT

A method and system for encoding a mark-up language document is provided, in which, the structure of the mark-up language document is condensed by removing those parts of the structure that are fixed, and by expressing the variable parts of the structure in terms of whether or how often they occur. A template that specifies which parts of the structure are fixed and which parts are variable may be provided to both the device that is transmitting the mark-up language document and the device that is receiving the mark-up language document.

5 Claims, 4 Drawing Sheets

U.S. PATENT DOCUMENTS

| | | | |
|---|---|---|---|
| 2002/0065822 A1* | 5/2002 | Itani | 707/7 |
| 2002/0073120 A1* | 6/2002 | Bierbrauer et al. | 707/513 |
| 2002/0073236 A1* | 6/2002 | Helgeson et al. | 709/246 |
| 2002/0087596 A1* | 7/2002 | Lewontin | 707/513 |
| 2002/0107866 A1* | 8/2002 | Cousins et al. | 707/102 |
| 2002/0107887 A1* | 8/2002 | Cousins | 707/513 |
| 2002/0120598 A1* | 8/2002 | Shadmon et al. | 707/1 |
| 2002/0138517 A1* | 9/2002 | Mory et al. | 707/513 |
| 2002/0138518 A1* | 9/2002 | Kobayashi et al. | 707/513 |
| 2002/0143521 A1* | 10/2002 | Call | 704/1 |
| 2002/0156803 A1* | 10/2002 | Maslov et al. | 707/500 |
| 2002/0157023 A1* | 10/2002 | Callahan et al. | 713/201 |
| 2002/0194227 A1* | 12/2002 | Day et al. | 707/523 |
| 2003/0005169 A1* | 1/2003 | Perks et al. | 709/315 |
| 2003/0014397 A1* | 1/2003 | Chau et al. | 707/3 |
| 2003/0018466 A1* | 1/2003 | Imaura | 704/6 |
| 2003/0023628 A1* | 1/2003 | Girardot et al. | 707/513 |
| 2003/0046317 A1* | 3/2003 | Cseri et al. | 707/513 |
| 2003/0050912 A1* | 3/2003 | Haley | 707/1 |
| 2003/0167445 A1* | 9/2003 | Su et al. | 715/513 |
| 2004/0177015 A1* | 9/2004 | Galai et al. | 705/35 |
| 2004/0205613 A1* | 10/2004 | Li et al. | 715/523 |
| 2004/0205615 A1* | 10/2004 | Birder | 715/523 |
| 2005/0138483 A1* | 6/2005 | Hatonen et al. | 714/45 |

FOREIGN PATENT DOCUMENTS

| | | | |
|---|---|---|---|
| WO | WO02025440 A2 | 3/2002 | |

OTHER PUBLICATIONS

Sundaresan, Neel, et al., "Algorithms and Programming Models for Efficient Representation of XML for Internet Applications", WWW10, Hong Kong, May 1-5, 2001, pp. 366-375 (ACM 1-58113-348-0/01/0005).*

Huang, Anita W., et al., "A Semantic Transcoding System to Adapt Web Services for Users With Disabilities", Assets '00, Arlington, VA, Nov. 13-15, 2000, pp. 156-163 (ACM 1-58113-314-8/00/0011).*

Jeuring, Johan, et al., "Genric Programming for XML Tools", Institute of Information and Computing Sciences, Utrecht University, The Netherlands, May 27, 2002, pp. 1-12.*

Wallace, Malcolm, et al., "Haskell and XML: Generic Combinators of Type-Based Translation?", ICFP '99, Paris, France, Sep. 1999, pp. 148-159 (ACM 1-58113-111-9/99/0009).*

Box, Don, et al., Essential XML: Beyond Markup, Addison-Wesley, Boston, MA, Sep. 2000, pp. 262-267.*

Liberty, Jesse, et al., XML Documents From Scratch, Que Corp., Indianapolis, IN, Mar. 2000, pp. 135-140 and 237.*

Holzner, Steven, Inside XML, New Riders Publishing, Indianapolis, IN, Nov. 2001, pp. 619-643.*

Liefke, Hartmut, et al., "An Extensible Compressor for XML", SIGMOD Record, vol. 29, No. 1, Mar. 2000, pp. 57-62.*

Liefke, Hartmut, et al., "Xmill: An Extensible Compressor for XML", MOD 2000, Dallas, TX, © 2000, pp. 153-164 (ACM 1-58113-218-2/00/05).*

Microsoft Computer Dictionary, 5th Edition, Microsoft Press, Redmond, WA, © 2002, pp. 375-376.*

Su, Hong, et al., "Automating the Transformation of XML Documents", WIDM 2001, Atlanta, GA, Nov. 2001, pp. 68-75.*

Levene, Mark, et al., "XML Structure Compression", Proceedings of the Second International Workshop on Web Documents, May 2002, pp. 1-14.*

Gergatsoulis, Manolis, et al., "A Web-Based System for Handling Multidimensional Information through MXML", ADBIS 2001 (LNCS 2151), Vilnius, Lithuania, Sep. 25-28, 2001, pp. 352-365. .*

Boshernitsan, Marat, et al., "Designing an XML-Based Exchange Format for Harmonia", Proc. of 7th Working Conf. on Reverse Engineering, Nov. 23-25, 2000, pp. 287-289.*

Gergatsoulis, Manolis, et al., "Incorporating Dimensions in XML and DTD", Database and Expert Systems Applications (LNCS 2113), © 2001, pp. 646-656.*

Tolani, Pankaj M., et al., "XGRIND: A Query-Friendly XML Compressor", ICDE '02, Feb. 26-Mar. 1, 2002, pp. 225-234.*

Cover, The XML Cover Pages XML and Compression; pp. 1-4 (Feb. 19, 2001).

Dunn et al., Transcoding on the fly for the Web; developerWorks staff, pp. 1-11 (Nov. 1999).

Girardot et al., Millau: An encoding format for efficient representation and exchange of XML over the Web, pp. 1-26; (May 2002).

Liefke et al., XMILL: an Efficient Compressor for XML Data, pp. 1-26 (2000).

Thompson et al., XML schema part 1: Structures, W3C working draft, pp. 1-210 (1999) http://www/w3.org/TR/xmlschema-1.

Biron et al., XML schema part 2: Datatypes, W3 working draft, pp. 1-154 (1999) http://www.w3.org/TR/smlschema-2.

WAP Binary SML Content Format, W3C Note 24, (1999) pp. 1-22 http://www.w3.org/TR/wbxml/.

Deutsch, P., GZIP file format specification version 4.3, RFC 1952, Aladdin Enterprises, pp. 1-12 (1996) http://www9.ord/w9cdrom/154/154.html.

Girardot, et al., "Millau: An encoding format for efficent representation and exchange of XML over the web", Computer Networks and ISDN Systems, North Holland Publishing, vol. 33, No. 1-6, Jun. 2000, pp. 747-765.

Liefke, et al., XMILL: An Efficient Compressor for XML Data, Sigmod Record, vol. 29, No. 2, Jun. 2000, pp.153-164.

Sundaresan, et al., Algorithms and programming models for efficient representation of XML for internet applications Proceedings of the tenth international world wide web conference, May 1st. 2001, pp. 366-375.

\* cited by examiner

METHOD AND SYSTEM FOR ENCODING A MARK-UP LANGUAGE DOCUMENT

TECHNICAL FIELD

The present invention relates generally to data compression techniques and, more particularly, to techniques for compactly encoding mark-up language documents.

BACKGROUND OF THE INVENTION

Mark-up languages, such as Hypertext Mark-up Language (HTML) and Extensible Mark-up Language (XML), have been in widespread use for the past several years. Mark-up languages allow software developers to create documents that include a variety of data items, such as text, logos, pictures, and sounds, which can then be rendered by various types of programs, such as web browsers. Mark-up languages use special notations, referred to as tags, to identify data items, and to indicate how the data items are to be processed. These tags also allow computer programs, such as parsers and web browsers, to search, sort, identify and extract data from the document. While mark-up languages make the use and interchange of data easier and more user-configurable, the addition of tags along with the data substantially increases the size of data files. This increase in file size or "bloat" can be considerable, and creates problems when data has to be transmitted quickly or stored compactly.

SUMMARY OF THE INVENTION

In accordance with the foregoing, a method and system for encoding a mark-up language document is provided. According to the invention, the structure of the mark-up language document is condensed by removing those parts of the structure that are fixed, and by expressing the variable parts of the structure in terms of which elements occur, whether elements occur, or how often certain elements occur. This may involve separating the structure of the mark-up language document from its content, and treating the structure and content differently. To encode a block of mark-up language text according to an embodiment of the invention, a template is used to determine which of the elements of the block have a fixed number of occurrences and which of the elements have a variable number of occurrences. The structure of the block is represented with a compact block of text that expresses the number of occurrences of the elements that have a variable number of occurrences, but that does not contain information regarding the elements that have a fixed number of occurrences. In various embodiments of the invention, the content of the mark-up language document is, itself, compressed by grouping similar or related data items together.

Additional features and advantages of the invention will be made apparent from the following detailed description of illustrative embodiments that proceeds with reference to the accompanying figures.

BRIEF DESCRIPTION OF THE DRAWINGS

While the appended claims set forth the features of the present invention with particularity, the invention may be best understood from the following detailed description taken in conjunction with the accompanying drawings of which:

DETAILED DESCRIPTION OF THE INVENTION

Prior to proceeding with a description of the various embodiments of the invention, a description of the computer and networking environment in which various embodiments of the invention may be practiced will now be provided. Although it is not required, the present invention may be implemented by program modules that are executed by a computer. Generally, program modules include routines, objects, components, data structures and the like that perform particular tasks or implement particular abstract data types. The term "program" as used herein may connote a single program module or multiple program modules acting in concert. The invention may be implemented on a variety of types of computers. Accordingly, the terms "device" and "computer" as used herein include personal computers (PCs), hand-held devices, multi-processor systems, microprocessor-based programmable consumer electronics, network PCs, minicomputers, mainframe computers and the like. The invention may also be employed in distributed computing environments, where tasks are performed by remote processing devices that are linked through a communications network. In a distributed computing environment, modules may be located in both local and remote memory storage devices.

Figure 1:
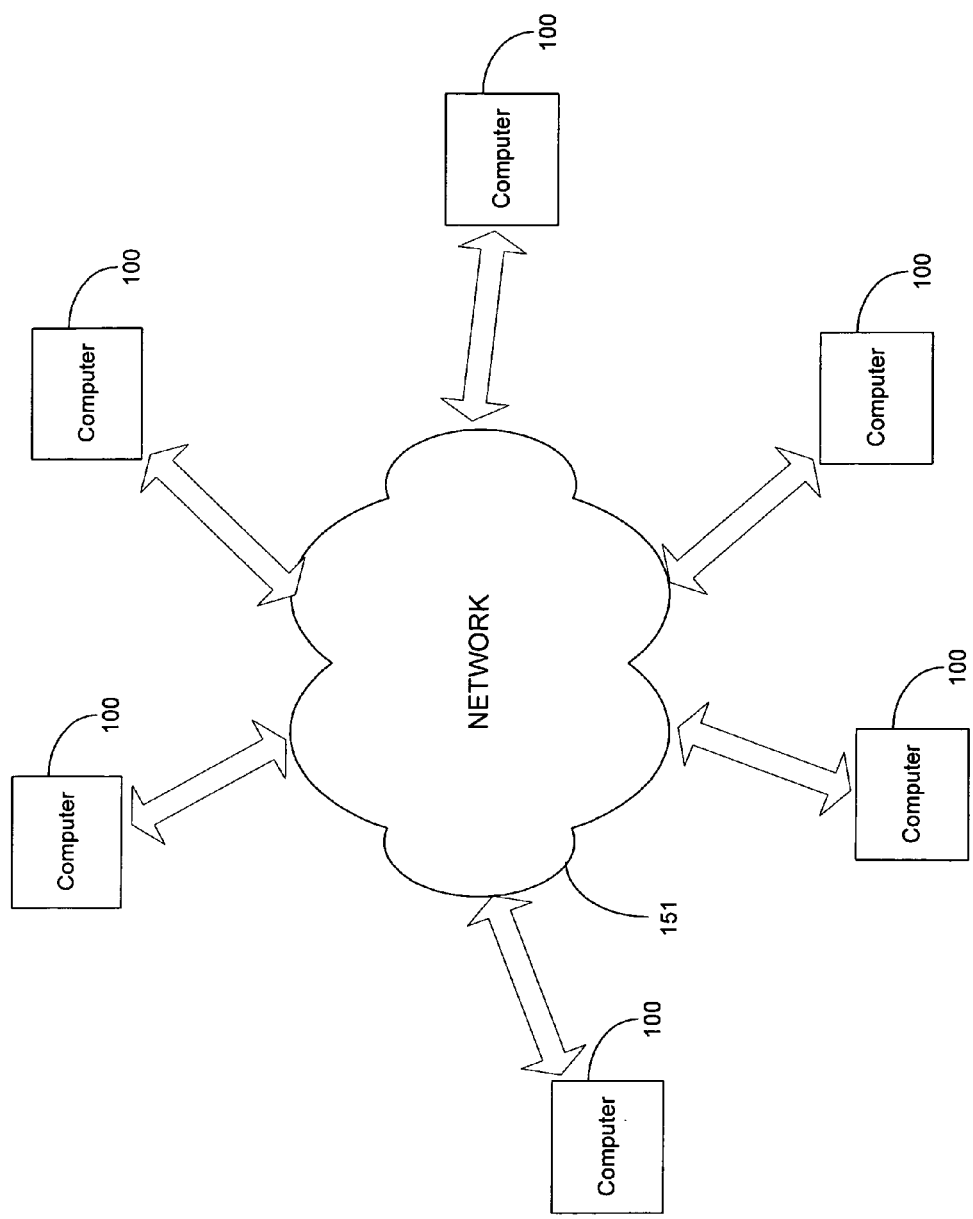
FIG. 1 shows an example of a computer network in which the invention may be practiced.

An example of a networked environment in which the invention may be used will now be described with reference to FIG. 1. The example network includes several computers 100 communicating with one another over a network 151, represented by a cloud. Network 151 may include many well-known components, such as routers, gateways, hubs, etc. and may allow the computers 100 to communicate via wired and/or wireless media.

Figure 2:
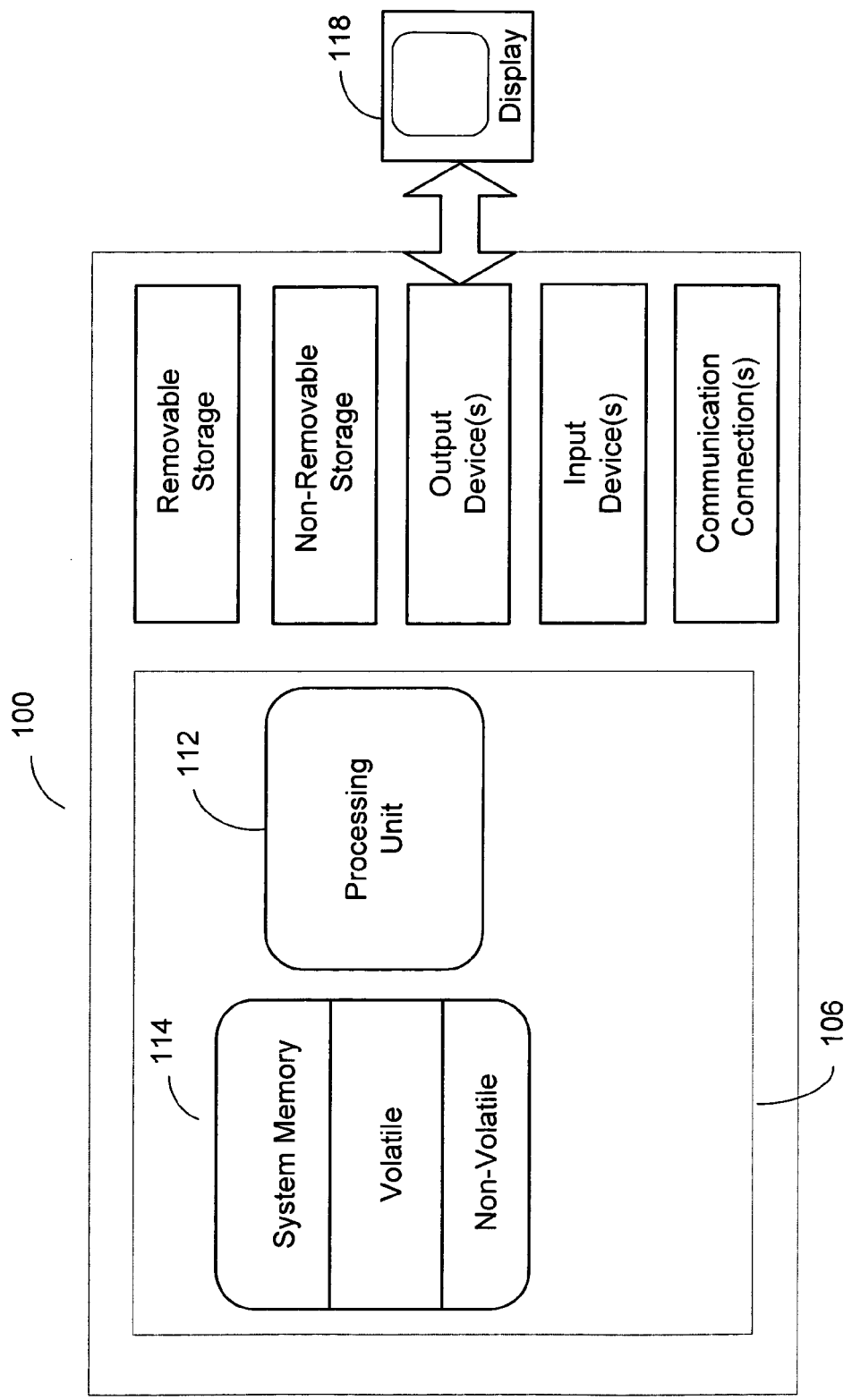
FIG. 2 shows an example of a computer on which at least some parts of the invention may be implemented.

Referring to FIG. 2, an example of a basic configuration for a computer on which the system described herein may be implemented is shown. In its most basic configuration, the computer 100 typically includes at least one processing unit 112 and memory 114. Depending on the exact configuration and type of the computer 100, the memory 114 may be volatile (such as RAM), non-volatile (such as ROM or flash memory) or some combination of the two. This most basic configuration is illustrated in FIG. 2 by dashed line 106. Additionally, the computer may also have additional features/functionality. For example, computer 100 may also include additional storage (removable and/or non-removable) including, but not limited to, magnetic or optical disks or tape. Computer storage media includes volatile and non-volatile, removable and non-removable media implemented in any method or technology for storage of information such as computer readable instructions, data structures, program modules, or other data. Computer storage media includes, but is not limited to, RAM, ROM, EEPROM, flash memory or other memory technology, CD-ROM, digital versatile disk (DVD) or other optical storage, magnetic cassettes, magnetic tape, magnetic disk storage or other magnetic storage devices, or any other medium which can be used to store the desired information and which can be accessed by the computer 100. Any such computer storage media may be part of computer 100.

Computer 100 may also contain communications connections that allow the device to communicate with other devices. A communication connection is an example of a communication medium. Communication media typically embodies computer readable instructions, data structures, program modules or other data in a modulated data signal such as a carrier wave or other transport mechanism and includes any information delivery media. By way of example, and not limitation, communication media includes wired media such as a wired network or direct-wired connection, and wireless media such as acoustic, RF, infrared and other wireless media. The term computer readable media as used herein includes both storage media and communication media.

Computer 100 may also have input devices such as a keyboard, mouse, pen, voice input device, touch input device, etc. Output devices such as a display 118, speakers, a printer, etc. may also be included. All these devices are well known in the art and need not be discussed at length here.

As used herein, the term "mark up language" refers to any computer interpretable language that describes the structure of a document. Examples of mark-up languages include Standard Generalized Mark-up Language (SGML) and all of its variants, including Hypertext Mark-up Language (HTML), Extensible Mark-up Language (XML) and Extensible Style Sheet Language (XSL). Furthermore, the term "mark-up language document" refers to any document that contains mark-up language. Finally, the phrase "block of mark-up language" is used to indicate a mark-up language document or a portion thereof.

The invention is generally directed to a method and system for encoding a mark-up language document. According to the invention, the structure of the mark-up language document is condensed by removing those parts of the structure that are fixed, and by expressing the variable parts of the structure in terms of which elements occur, whether elements occur, or how often certain elements occur. In various embodiments of the invention, other steps may be taken to further reduce the size of the mark-up language document. These steps include one or more of: separating the data items of the document from its structure, grouping together data items with related meaning or data-type, and encoding data items in their native format.

According to various embodiments of the invention, both the sender of the mark-up language document and the receiver of the mark-up language document possess a common template that defines a default structure for a document type. This default structure includes fixed elements—those elements that are always present in fixed number of occurrences in a mark-up language document of that type. The default structure also includes variable elements—those elements that may or may not be present in a mark-up language document of that type, or are always present, but may have any number of occurrences.

For example, the mark-up language document shown in Table 1 describes a "books" element, which describes a set of books:

TABLE 1

```
<books>
    <book>
        <title> Wireless & Networking - I </title>
        <authors>
            <author>
                <firstName> Peter </firstName> <lastName>
                K. </lastName>
            </author>
        </authors>
        <ISBN> 0-201-37928-7 </ISBN>
        <price> 99.99 </price>
    </book>
```

TABLE 1-continued

```
    <book>
        <title>Wireless & Networking - II </title>
        <authors>
            <author>
                <firstName> Peter </firstName> <lastName>
                K. </lastName>
            </author>
            <author>
                <firstName> John </firstName> <lastName>
                S. </lastName>
            </author>
        </authors>
        <price> 59.99 </price>
    </book>
</books>
```

The document of Table 1 is written using the Extensible Mark-up Language (XML). Within the "books" element are "books" elements, each of which describes a book. Each "book" element includes a "title" element, an "authors" element, a "price" element and, optionally, an "ISBN" element. The "title" element includes the title of the book. The "authors" element describes all of the authors of the book. The "authors" element includes one or more "author" elements. Each "author" element has a "firstName" element and a "lastName" element. The "firstName" element contains the first name of the author, while the "lastName" element contains the last name of the author. Each element of the document of Table 1 is bounded by a pair of tags. For example, the first "title" element in Table 1 is <title>Wireless & Networking—I</title>. The data contained in the element is Wireless & Networking—I. The element is bounded by the tags < title>and </title>. Collectively, all of the tags of the mark-up language document of Table 1 constitute the structure of the document.

Referring to Table 2, an example of a template that that may be used for the mark-up language document of Table 1 according to an embodiment of the invention will now be described. The template is formatted as an XML Document Type Definition (DTD):

TABLE 2

```
<!ELEMENT book (title, authors, ISBN?, price)>
<!ELEMENT title (#PCDATA)>
<!ELEMENT authors (author)+>
<!ELEMENT author (firstName, lastName)>
<!ELEMENT ISBN (#PCDATA)>
<!ELEMENT firstName (#PCDATA)>
<!ELEMENT lastName (#PCDATA)>
<!ELEMENT price (#PCDATA)>
```

As an alternative, the template may be formatted as a schema, as shown in Table 3:

TABLE 3

```
<xsd:schema xmlns:xsd='http://www.w3.org/2001/XMLSchema'>
<xsd:element name='book'>
<xsd:complexType>
    <xsd:sequence>
    <xsd:element name='title'type='txsd:string'/>
    <xsd:element name='authors'type='Authors'/>
    <xsd:element name='ISBN'type='xsd:string' minOccurs'0'/>
    <xsd:element name='price' type='xsd:decimal'/>
    </xsd:sequence>
</xsd:complexType>
</xsd:element>
```

TABLE 3-continued

```
<xsd:type name='Authors'/>
      <xsd:sequence>
<xsd: element name='author' maxOccurs='unbounded'>
      <xsd: complexType>
           <xsd: sequence>
                <xsd:element name='firstName' type='xsd:string'/>
                <xsd:element name='lastName' type='xsd:stringt'/>
           </xsd: sequence>
      </xscl:complexType>
</xsd:element>
      </xsd:sequence>
</xsd:type>
</xsd:schema>
```

There are many other possible ways to format the template. For example, other mark-up languages or programming languages besides those shown herein may be used.

The meaning of some of the labels and terms of the DTD document of Table 2 will now be described. The label "#PCDATA" signifies parsed character data (plain text, for example). The symbols ?, + and * are used as follows:

"?" signifies an element that either does not appear or appears one time

"+" signifies an element that appears one or more times

"*" signifies an element that can appear any number of times or not at all

Those elements of the template of Table 2 that have one or the above symbols are variable elements, meaning that the structure of an XML document of this type may vary with respect to these elements, and do so in the way dictated by the symbols. All other elements defined in the template are fixed elements, meaning that the structure of an XML document of this type is exactly as specified in the template with respect to those elements. For example, according to the template of Table 2, each book element contains exactly one instance each of a title element and a price element. However, the ISBN element may appear once or not at all. Similarly "authors" element contains one or more instances of the "author" element.

According to an embodiment of the invention, a sender that wishes to send a mark-up language document to a receiver removes all of the tags that are associated with elements that are fixed—those elements that the sender and receiver both realize will be always be in the document and will always appear in a fixed number of instances. Furthermore, the sender need not send the tags associated with variable elements, but only needs to send information indicating how many instances of each variable element exist in the mark-up language document being sent. For example, if a sender and receiver each have a copy of the DTD document of Table 2, and they each understand that the mark-up language document that is to be sent conforms to the DTD document of Table 2, then the entire structure of the mark-up language document of Table 1 (that is, the tags) can be represented as $1_{(integer)} 1_{(single\ bit)}, 2_{(integer)} 0_{(single\ bit)}$, where the first number in each pair is the number of occurrences of the "author" element and the second number is a single bit that is set high if there is an "ISBN" element and low if there is not.

According to some embodiments of the invention, the data items of a mark-up language document and the structure of the mark-up language document are separated from one another. Separating the data items from the structure allows each to be processed separately. Processing the structure (the tags, for example) involves techniques such as using a template, as described above. Processing the data items (the text between pairs of tags, for example) involves techniques such as grouping data items with related meaning or type, and encoding data items in their native format.

To further illustrate the invention, an example of how the mark-up language document of Table 1 is processed according to an embodiment of the invention will now be described. First, the structure of the document (the tags, in this case) is separated from the content (the data items between the tags, in this case), as shown in Table 4:

TABLE 4

| Structure | Content |
|---|---|
| <books> | |
|    <book> | |
|       <title> </title> | Wireless & Networking - I |
|       <authors> | |
|          <author> | |
|             <firstName> </firstName> | Peter |
|             <lastName> </lastName> | K. |
|          </author> | |
|       </authors> | |
|       <ISBN> </ISBN> | 0-201-37928-7 |
|       <price> <lprice> | 99.99 |
|    </book> | |
|    <book> | |
|       <title> </title> | Wireless & Networking - II |
|       <authors> | |
|          <author> | |
|             <firstName> </firstName> | Peter |
|             <lastName> </lastName> | K. |
|          </author> | |
|          <author> | |
|             <firstName> </firstName> | John |
|             <lastName> </lastName> | S. |
|          </author> | |
|       </authors> | |
|       <price> </price> | 59.99 |
|    </book> | |
| </books> | |

Next, those data items that are of the same type or of similar type are grouped together, as shown in Table 5:

TABLE 5

| Structure | Content |
|---|---|
| <books> | |
|    <book> 1 </book> | |
| <authors> | Wireless & Networking - I |
|    <author> | Wireless & Networking - II |
|       <firstName></firstName> | |
|    <lastName> </lastName> | Peter |
|    </author> | Peter |
| </authors> | John |
| <ISBN> </ISBN> | |
| <price> </price> | K. |
| </book> | K. |
| <book> | S. |
|    <title> </title> | |
|    <authors> | 0-201-37928-7 |
|       <author> | |
|          <firstName> </firstName> | 99.99 |
|          <lastName> </lastName> | 59.99 |
|       </author> | |
|       <author> | |
|          <firstName> </firstName> | |
|          <lastName> </lastName> | |
|       </author> | |
|    </authors> | |
|    <price> </price> | |
| </book> | |
| </books> | |

Note that, in this example, the titles are grouped together, the author first names are grouped together, the author last names are grouped together, and the prices are grouped together. Grouping together like data items in this manner allows the data items to be compressed more efficiently. One reason for this is that there are more likely to be duplicate data items next to one another when the data items are grouped by type. For example, Peter K. was an author of both of the books described in the mark-up language document of Table 1. After grouping like data types together (Table 5), the data item "Peter" now occurs twice consecutively. Many existing compression tools, such as GZip, can take advantage of repeated terms that are proximate to one another by simply eliminating the duplicates and replacing them with a number that represents how many times they occur. Furthermore, the data items are encoded in their native format. For example, floating point numbers are encoded as floating point numbers, even though they may have been treated as characters in the mark-up language document. Similarly, integers are encoded as integers, characters are encoded as characters, and so on.

The structure of the mark-up language document is then processed according to a template, as described above. All of those tags that are fixed—always in the document in a fixed number of instances—are removed. All of the tags that are variable are represented by the number of occurrences of the elements that they represent:

TABLE 6

| Structure | Content |
|---|---|
| $1_{(integer)}\ 1_{(single\ bit)},\ 2_{(integer)}\ 0_{(single\ bit)}$ | Wireless & Networking-I |
| | Wireless & Networking-II |
| | Peter |
| | Peter |
| | John |
| | K. |
| | K. |
| | S. |
| | 0-201-37928-7 |
| | 99.99 |
| | 59.99 |

In accordance with various embodiments of the invention, the structure of a mark-up language document and the content of the mark-up language document may be compressed separately and compressed according to different compression schemes. Additionally, certain types of content may be compressed according to different compression schemes. For example, to achieve a higher compression ratio from certain applications (that use certain data types), special purpose compressors can be used. Some types of data, such as integer data or calendar dates, can be encoded in binary. In the previous example, the "price" data items could be encoded using integers. Differential or delta encoding is useful for numeric data in which there is little variation. For example, 10200, 10240, 10185, . . . would be encoded as 10200, +40, −55, −3 . . . More complex compression schemes can be applied to a variety of specialized data types, such as images, sounds, DNA sequences, and so on. Finally, each separate component of the mark-up language document—whether it is the structure, the data items, or individual groups of data items—can be further compressed using a general purpose compression tool, such as GZip or bzip2.

Figure 3:
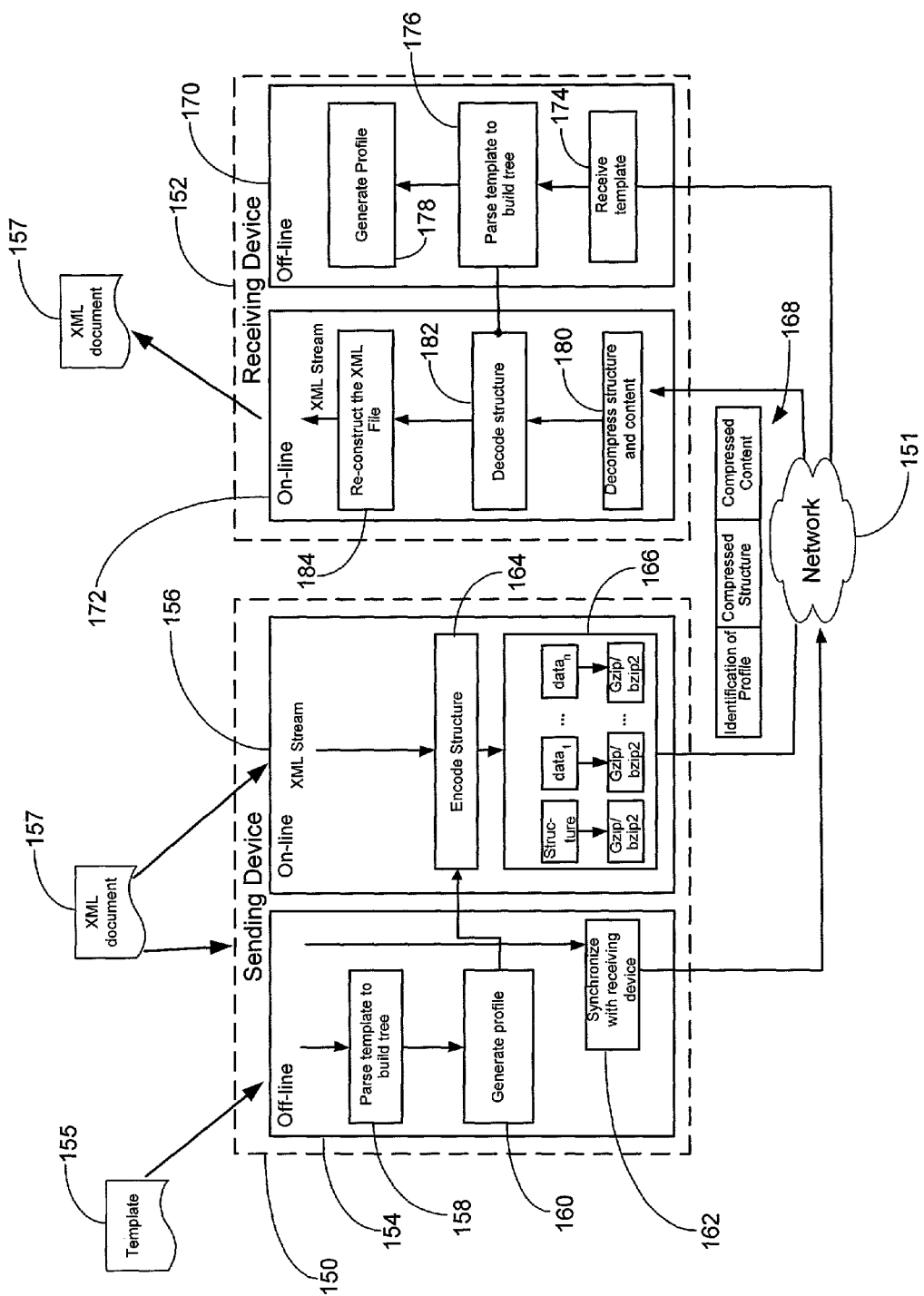
FIG. 3 shows an example of a procedure that may be used in an embodiment of the invention.
Figure 4:
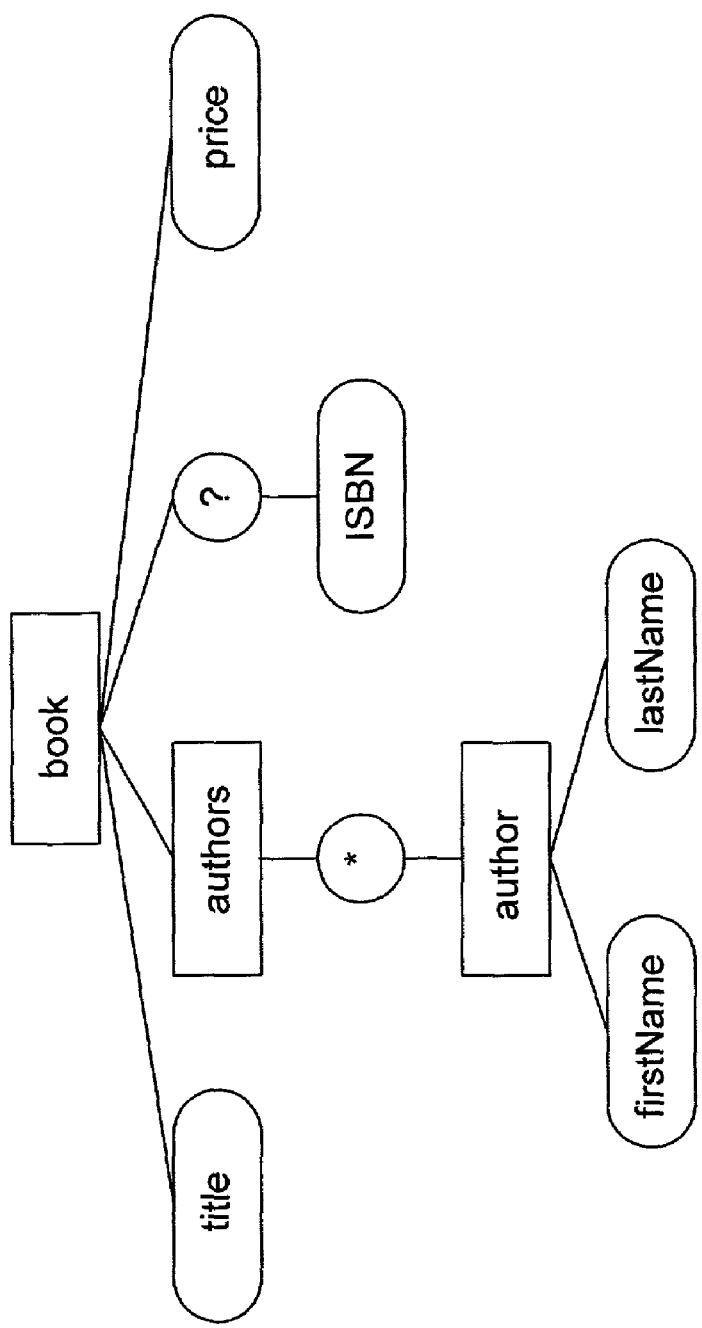
FIG. 4 shows an example of a tree that is created based on a template in an embodiment of the invention.

There are many different ways in which the various embodiments of the invention described herein may be implemented. Referring to FIG. 3, an example of a process that may be used in an embodiment of the invention will now be described. FIG. 3 illustrates a sending device 150 and a receiving device 152. Block 154 on the sending device 152 represents those tasks that are handled off-line by the sending device 150, while block 156 represents those tasks that are handled on-line by the sending device 150. As used herein, the term "on-line" refers to tasks taking place while a mark-up language document is in the process of being transferred from the sending device 150 to the receiving device. "Off-line" as used herein refers to tasks taking place at all other times. At step 158, the sending device 150 retrieves a template 155 (which, in this example is a DTD or an XML schema) parses the template 155, and builds a logical tree representing an XML tag structure. An example of a logical tree that would be generated for the "Books" DTD of Table 2 is graphically represented in FIG. 4. At step 160, the sending device 150 then generates an XML profile based on the tree. In parallel with steps 158 and 160, the sending device 150 uses the template 155 to synchronize with the receiving device 152 at step 162. This may involve the sending device 150 transmitting the template 155 to the receiving device 152 prior to any attempt by the sending device 150 to encode and transmit a mark-up language document to the receiving device 152.

At step 164, the sending device 150 obtains an XML document 157 and the XML profile generated at step 160, separates the structure (the tags of the XML document) from the content (the data items between sets of tags), encodes the structure of the XML document 157 according to the profile, and optimizes the content. This encoding and optimizing process involves one or more of the techniques previously discussed in conjunction with Tables 4, 5, and 6. At step 166, the sending device 150 compresses the encoded structure and the data content according to a well-known compression scheme (GZip or Bzip2, in this example). The sending device 150 then creates a message 168 that includes the compressed and encoded structure, the compressed content, and data that identifies the profile that is to be used by the receiving device 152 when it interprets the message 168. The sending device 150 then transmits the message 168 to the receiving device 152 over the network 151.

Like the sending device 150, the receiving device 152 performs certain tasks off-line, which are represented by block 170, and performs certain tasks on-line, which are represented by block 172. During an off-line period, the receiving device 152 receives the template 155 at step 174 from the sending device 150. At step 176, the receiving device 152 then parses the template 155 to build a tree that represents an XML tag structure. The tree built by the second device 152 should look like the one built by the first device 150 at step 160. At step 178, the sending device 152 then generates an XML profile based on the tree.

During an on-line period, the second device 152 receives the message 168 and decompresses it at step 180. At step 182, the second device 152 decodes the structure portion of the message 168 using the tree created at step 176. This decoding may involve establishing a default tag structure based on the fixed elements of the XML document, and filling in the correct number of instances of the tags representing the variable elements. Finally, at step 184, the second device 152 reconstructs the XML document 157 by inserting the data items between the correct sets of tags generated at step 182.

It can thus be seen that a new a useful method and system for encoding a mark-up language document has been provided. In view of the many possible embodiments to which the principles of this invention may be applied, it should be recognized that the embodiments described herein with respect to the drawing figures is meant to be illustrative only and should not be taken as limiting the scope of invention. For example, those of skill in the art will recognize that the elements of the illustrated embodiments shown in software may be implemented in hardware and vice versa or that the illustrated embodiments can be modified in arrangement and detail without departing from the spirit of the invention. Therefore, the invention as described herein contemplates all such embodiments as may come within the scope of the following claims and equivalents thereof.

We claim:

1. A method implemented by a sending computer, the method comprising:

identifying a template that defines a structure for a block of mark-up language wherein the block of mark-up language has an associated document type and wherein the block of mark-up language comprises:
  a plurality of elements;
  a plurality of sets of tags; and
  a plurality of data items;
  wherein individual ones of the plurality of elements each comprise:
    a particular set of tags from the sets of tags; and
    a particular data item from the plurality of data items;

parsing the template to build a first logical tree that represents a structure of the plurality of sets of tags in the block of mark-up language, wherein the structure defines:
  relative locations of sets of tags of fixed elements, which are present and occur a fixed number of times in the block of mark-up language;
  relative locations of sets of tags of optional elements, which may or may not be present, and if present, occur only one time in the block of mark-up language;
  relative locations of sets of tags of variable elements, which are present and may occur any number of times in the block of mark-up language; and
  relative locations of sets of tags of variably optional elements, which may or may not be present, and if present, may occur any number of times in the block of mark-up language;

sending the template to a receiving computer, thereby enabling the receiving computer to build a second logical tree that is identical to the first logical tree;

identifying a document block having the document type, such that:
  the document block comprises:
    a plurality of document elements;
    a plurality of sets of document tags; and
    a plurality of document data items;
    wherein individual ones of the plurality of document elements each comprise:
      a particular set of document tags from the plurality of sets of document tags; and
      a particular document data item from the plurality of document data items;
  a structure of the plurality of sets of document tags in the document block is represented by the first logical tree such that each individual document element of the plurality of document elements is one of:
    a fixed document element corresponding to a fixed element, as defined by the first logical tree;
    an optional document element corresponding to an optional element, as defined by the first logical tree;
    a variable document element corresponding to a variable element, as defined by the first logical tree; or
    a variably optional document element corresponding to a variably optional element, as defined by the first logical tree, encoding the document block using the first logical tree by:
  for each document element in the document block, separating the set of document tags of the document element from the document data item of the document element, resulting in a structure component of the document block and a data component of the document block, wherein the structure component of the document block is distinct from the data component of the document block;
  for each fixed document element in the document block, removing from the structure component of the document block, the set of document tags of the fixed document element;
  for each optional document element in the document block, replacing in the structure component of the document block, the set of document tags of the optional document element with an indicator that the optional document element is present;
  for each optional element indicated in the first logical tree, but not present in the document block, adding to the structure component of the document block, an indicator that the optional element is not present;
  for each variable document element in the document block:
    determining a number of times that the variable document element appears in the document block;
    adding to the structure component of the document block, an indicator of the number of times that the variable document element appears in the document block; and
    removing from the structure component of the document block, the set of document tags associated with each occurrence of the variable document element;
  for each variably optional document element in the document block:
    determining a number of times that the variably optional document element appears in the document block;
    adding to the structure component of the document block, an indicator of the number of times that the variably optional document element appears in the document block; and
    removing from the structure component of the document block, the set of document tags associated with each occurrence of the variably optional document element; and
  for each variably optional element indicated in the first logical tree, but not present in the document block, adding to the structure component of the document block, an indicator that the variably optional element is not present,
  such that the structure component of the document block, when fully encoded, does not include any sets of document tags, does not include any representation of fixed elements, and comprises:
    indicators of the number of times that variable document elements appear in the document block;
    indicators of the number of times that variably optional elements appear in the document block; and
    indicators of variably optional elements that are not present in the document block; and sending the encoded structure component of the document block and the data component of the document block from the sending computer to the receiving computer with an indication of the document type, thereby enabling the receiving computer to use the second logical tree to decode the encoded document block.

2. A computer-readable storage medium having stored thereon computer-executable instructions for performing the method of claim 1.

3. A system for transferring a mark-up language document, the mark-up language having a plurality of elements, each element comprising a data item and a set of tags bounding the data item, the system comprising:
 a sending device comprising:
 a processor;
 a memory;
 a component for determining, based on a mark-up language template, which elements appear in the mark-up language document a fixed number of times;
 a component for removing from the mark-up language document, the tags that correspond to those elements determined to appear a fixed number of times;
 a component for determining, based on the mark-up language template, which elements of the mark-up language document appear in the mark-up language document a variable number of times;
 a component for removing from the mark-up language document, the tags that correspond to those elements determined to appear a variable number of times;
 a component for creating a message, separate from the mark-up language document, that contains numerical values that correspond to the number of times that those elements that are determined to appear in the mark-up language document a variable number of times appear, but does not contain information regarding those elements that are determined to appear in the mark-up language document a fixed number of times; and
 a component for transmitting the message and the mark-up language document sans tags to a receiving device, wherein the receiving device is configured to:
  receive the message and the mark-up language document sans tags;
  determine which elements appear in the mark-up language document a fixed number of times;
  determine which elements of the mark-up language document appear in the mark-up language document a variable number of times; and
  recreate the mark-up language document with tags.

4. A computer-implemented method for transferring a mark-up language document, the mark-up language having a plurality of elements, each element comprising a data item and a set of tags bounding the data item, the computer-implemented method comprising:
 determining, based on a mark-up language template, which elements appear in the mark-up language document a fixed number of times;
 removing from the mark-up language document, the tags that correspond to those elements determined to appear a fixed number of times;
 determining, based on the mark-up language template, which elements of the mark-up language document appear in the mark-up language document a variable number of times;
 removing from the mark-up language document, the tags that correspond to those elements determined to appear a variable number of times;
 creating a message, separate from the mark-up language document, that contains numerical values that correspond to the number of times that those elements that are determined to appear in the mark-up language document a variable number of times appear, but does not contain information regarding those elements that are determined to appear in the mark-up language document a fixed number of times; and
 storing the message in computer storage media; and
 transmitting the message and the mark-up language document sans tags to a receiving device, wherein the receiving device is configured to:
  receive the message and the mark-up language document sans tags;
  determine which elements appear in the mark-up language document a fixed number of times;
  determine which elements of the mark-up language document appear in the mark-up language document a variable number of times; and
  recreate the mark-up language document with tags.

5. A computer-readable medium having stored thereon computer-executable instructions for performing the method of claim 4.

* * * * *